(12) United States Patent
Kinugasa et al.

(10) Patent No.: US 7,049,867 B2
(45) Date of Patent: May 23, 2006

(54) PLL CIRCUIT AND IMAGE DISPLAY DEVICE

(75) Inventors: Norihide Kinugasa, Joyo (JP); Yoshio Nirasawa, Muko (JP); Hideo Hamaguchi, Takatsuki (JP); Sachi Ota, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 36 days.

(21) Appl. No.: 10/915,340

(22) Filed: Aug. 11, 2004

(65) Prior Publication Data

US 2005/0040872 A1  Feb. 24, 2005

(30) Foreign Application Priority Data

Aug. 20, 2003  (JP)  ............................. 2003-296499

(51) Int. Cl.
*H03L 7/06* (2006.01)

(52) U.S. Cl. ....................... 327/157; 375/376
(58) Field of Classification Search ............... None
See application file for complete search history.

(56) References Cited

U.S. PATENT DOCUMENTS 4,456,884 A * 6/1984 Yarborough, Jr. ............ 341/72
5,281,926 A * 1/1994 Rabii ............................ 331/14
6,166,606 A * 12/2000 Tsyrganovich ............... 331/25
6,222,590 B1 * 4/2001 Makino ....................... 348/547

FOREIGN PATENT DOCUMENTS

JP        63-215265 A        9/1988

* cited by examiner

*Primary Examiner*—Minh Nguyen
(74) *Attorney, Agent, or Firm*—McDermott Will & Emery LLP

(57) ABSTRACT

A PLL circuit that makes a voltage-controlled oscillator converge to a stable state within a short time and generates a clock signal with high stability even when discontinuity occurs in the period of a reference input signal is provided. The PLL circuit has a voltage-controlled oscillator for outputting a clock controlled, a first counter reset by the reference input signal having one period longer than a reference period within a predetermined period for outputting a first signal, a second counter for outputting a second signal, a reset pulse generating circuit for resetting the second counter, a loop filter for holding and outputting the control voltage varied by a phase error signal and a discontinuous input detecting part for detecting the reference input signal input initially after its period becomes longer than the reference period.

7 Claims, 6 Drawing Sheets

US 7,049,867 B2

PLL CIRCUIT AND IMAGE DISPLAY DEVICE

BACKGROUND OF THE INVENTION

The present invention relates to a PLL (Phase Locked Loop) circuit and an image display device.

The PLL circuit is operated so as to obtain an oscillatory frequency acquired by multiplying the frequency of a reference input signal by N as an output signal of a voltage-controlled oscillator (hereinafter referred to as "VCO") and match the phase of the reference input signal to that of 1/N dividing signal (N is an arbitrary positive integer) of the VCO output signal. The PLL circuit is widely used in the analog circuit/digital circuit mixed system such as digital consumer electronics products.

Referring to FIG. 5 and FIG. 6, a conventional PLL circuit will be described. FIG. 5 is a schematic diagram of the conventional PLL circuit. The conventional PLL circuit has a reference input signal input terminal 90, a pulse width setting circuit 110, a phase comparator 140, a charge pump 150, a loop filter 160, a voltage-controlled oscillator (VCO) 100 and a 1/N frequency divider 430. The pulse width setting circuit 110 has a differentiating circuit 111 and a first counter 112. The 1/N frequency divider 430 has a second counter 132 and a reset pulse generating circuit 131. The loop filter 160 is comprised of an integrating circuit (not shown) having a capacitor and a resistance. A clock CLK is supplied to the differentiating circuit, the first counter 112, the second counter 132 and the reset pulse generating circuit 131 from the VCO 100.

The conventional PLL circuit is a generating circuit of a clock for driving an image display device (such as a liquid crystal display device). A reference input signal HD is a horizontal driving signal (horizontal synchronizing signal) extracted from an image signal input to the image display device. An output pulse of the VCO 100 (hereinafter referred to as "clock") is used as a pixel driving pulse for shifting the input image signal on a pixel-by-pixel basis in the lateral direction (to input the image signal to a shift register with a length of one horizontal period). An output pulse of the second counter 132 (output pulse of the 1/N frequency divider 430) is used as a driving pulse for shifting an image signal of one horizontal period every horizontal period in the longitudinal direction.

The operation of the differentiating circuit 11 and the first counter 112, which constitute the pulse width setting circuit 110, will be described below. The differentiating circuit 111 detects a trailing edge of the reference input signal HD input from the reference input signal input terminal 90 and generates a first differential pulse HDR having a time width of one period of the clock CLK.

The first counter 112 receives the clock CLK at its clock input terminal and the first differential pulse HDR at its reset input terminal (active in low level). The first counter 112 is reset by the first differential pulse HDR, counts the clock CLK, decodes the count value and outputs the decoded value as a first signal HSC50. The count value of the first counter 112 at the reset is defined as M (M is a positive integer). If the period of the reference input signal HD is a reference period $T_H$, M substantially corresponds to N in the PLL's phase locked state (N is a value set arbitrarily according to the design specification. In the conventional example, N is the number of pixels for one horizontal period). The first signal HSC50 has a rising edge at the timing of the trailing edge of the reference input signal HD, and a trailing edge at a predetermined timing. When the period of the reference input signal HD is in the proximity of the reference period $T_H$, the duty ratio of the first signal HSC50 is typically set to be about 50%.

The operation of the reset pulse generating circuit 131 and the second counter 132, which constitute the 1/N frequency divider 430, will be described below. When the reset pulse generating circuit 131 receives the count value of the second counter 132 and, if the count value corresponds to N, it outputs a reset pulse PLL50R having a time width of one period of the clock CLK. The second counter 132 receives the clock CLK at its clock input terminal and the reset pulse PLL50R at its reset input terminal (active at low level). The second counter 132 is self-reset by the reset pulse PLL50R, counts the clock CLK, decodes the count value and outputs the decoded value as a second signal PLL50. Preferably, the second counter 132 is configured so that the duty ratio of the second signal PLL50 is about 50%. The 1/N frequency divider 430 (the second counter 132) has a rising edge at the reset timing, and a trailing edge at a predetermined timing. It may be configured so that the second signal PLL50 has the trailing edge at the timing when a predetermined time has elapsed after the reset of the second counter 132.

The phase comparator 140 compares the rising edge of the first signal HSC50 (phase of the reference input signal HD) with the trailing edge of the second signal PLL50 (phase of the 1/N frequency divider 430) and outputs a phase error signal (up signal or down signal) having a time width corresponding to the phase difference.

The charge pump 150 receives the phase error signal. In the case where the input phase error signal is the up signal., the charge pump 150 passes a certain amount of charge current $I_{up}$ (the control voltage Vf increases); and in the case where the input phase error signal is the down signal, the charge pump 150 passes a certain amount of discharge current $I_{down}$ (the control voltage Vf decreases) to a control voltage Vf held by the capacitor of the loop filter 160. The loop filter 160 holds the control voltage Vf of the VCO 100, with high frequency components thereof being removed. The VCO 100 receives a feedback input of the control voltage Vf and oscillates at the corresponding frequency to output the clock CLK.

The second counter 132 may output a window signal WINDOW having a time width of a predetermined period before and after the trailing edge (phase comparing timing) of the second signal PLL50 (In FIG. 6, the period from W1 to W2 during which the window signal WINDOW is high level). In this case, the phase comparator 140 outputs the phase error signal within the range of the window signal WINDOW. As a result, in such a case where one horizontal synchronizing signal of the input image signal lacks (It is not that the period of the horizontal synchronizing signal is changed), the oscillating frequency of PLL can be controlled so as not to change by a predetermined value or greater.

With the configuration mentioned above, the conventional PLL circuit follows the frequency of the reference input signal HD and outputs the second signal PLL50 in synchronization with the clock CLK having a frequency of N times larger than the above frequency and the reference input signal HD. It is defined that the period of the reference input signal HD (reference period) is $T_H$ and the oscillating period of the clock CLK is $T_{CLK}$ ($T_H = N \times T_{CLK}$).

Referring to FIG. 6, the operation of the conventional PLL circuit will be described in detail. FIG. 6 is a timing chart showing the operation of the conventional PLL circuit. At times of t1, t2, t5, t8, t9 and t10 in FIG. 6, the reference input signal HD is input to the reference input signal input terminal 90.

At the time t2 in FIG. 6, the trailing edge of the reference input signal HD arrives. The first counter 112 reset at the trailing edge of the reference input signal HD outputs the first signal HSC50 having the rising edge at the time t2. The second counter 132 outputs the second signal PLL50 having the trailing edge at the time t3 later than the time t2. The phase comparator 140 sends the up signal (phase error signal) to the charge pump 150 during the points of time t2 and t3. The charge current $I_{up}$ is passed to the capacitor that constitutes the loop filter 160, thereby to increase the control voltage Vf. As a result, the oscillating frequency of the VCO 100 becomes larger (the period $T_{CLK}$ becomes shorter) and feedback is performed to match the rising edge of the first signal HSC50 to the trailing edge of the second signal PLL50.

At the time t5, the next trailing edge of the reference input signal HD arrives. The pulse width setting circuit 110 generates the first signal HSC50 having the rising edge at the time t5. The 1/N frequency divider 430 outputs the second signal PLL50 having the trailing edge at the time t4 prior to the time t5. The phase comparator 140 sends the down signal (phase error signal) to the charge pump 150 during the points of time t4 and t5. The discharge current $I_{down}$ is passed to the capacitor that constitutes the loop filter 160, thereby to decrease the control voltage Vf. As a result, the oscillating frequency of the VCO 100 becomes smaller (the period $T_{CLK}$ becomes longer) and feedback is performed to match the rising edge of the first signal HSC50 to the trailing edge of the second signal PLL50.

In the case where the period of the reference input signal HD is stable in proximity of the reference period $T_H$, the conventional PLL circuit can lock the period $T_{CLK}$ of the VCO 100 to $T_H$/N by repeating such feedback. At this time, the count value M of the first counter 112 at the reset is substantially same as the count value N of the second counter 132 at the reset.

In a liquid crystal display, for example, an image signal for displaying an image on the screen is driven by the output clock CLK and the second signal PLL50 of the PLL circuit in which the horizontal synchronizing signal is set as the reference input signal HD. For example, in the image signal according to PAL system, a vertical synchronizing period TV for one field (period of a vertical synchronizing signal VD) is equal to 312.5 horizontal synchronizing periods $T_H$ (1 TV=312.5 $T_H$). When the image signal of PAL system is displayed on a liquid crystal panel, it is necessary to adjust the vertical synchronizing period TV to be an integral multiples of the horizontal synchronizing period (for example, 1 TV=312×horizontal synchronizing period) by skipping the number of lines in one vertical synchronizing period (1 TV) (which is equal to the number of pulses of the horizontal synchronizing signal). This skipping processing is performed by extending the reference period TH corresponding to V compressibility of PAL system to be longer than 64 μsec as one horizontal synchronizing period of standard PAL system in a stage prior to the PLL circuit. In this case, it is required to maintain the phase relationship between the vertical synchronizing signal and the horizontal synchronizing signal by extending one horizontal synchronizing period within the vertical retrace period to be longer than the reference period $T_H$ corresponding to V compressibility of PAL system ($T_H$ is 64 μsec or more) once during one vertical synchronizing period TV (to be less than twice as long as $T_H$). That is, the period of the horizontal synchronizing signal needs to be made discontinuous once during one vertical synchronizing period TV. Only one period of the reference input signal HD input to the PLL circuit (horizontal synchronizing signal) is extended to be longer than the reference period $T_H$ in one vertical synchronizing period TV, and other 311 periods become the reference period $T_H$ (for example, the waveform of HD in FIG. 6).

Next, when the period of the reference input signal HD is extended to be longer than the reference period $T_H$ once in the vertical synchronizing period TV and then returned to be the reference period $T_H$, the operation of the conventional PLL circuit will be described below.

At the times t5, t8, t9 and t10 in FIG. 6, the trailing edge of the reference input signal HD arrives. During the times t5 and t8, the period of the reference input signal HD is extended to be 1.5 times as long as the reference period $T_H$ (less than twice), thereby to become the period $T_{SKEW}$. During the times t8 and t9 and the times t9 and t10, the period of the reference input signal HD returns to be the reference period $T_H$ again.

While the reference input signal HD arrives about at the time t6 when its period remains to be the reference period $T_H$, the reference input signal HD arrives at the time t8 later than the time t6 in the period $T_{SKEW}$. The phase difference between the first signal HSC50 and the second signal PLL50 is expressed as the time period between the points of time t6 and t8. Nevertheless, as the window signal WINDOW shifts to the low level at the time t7 prior to the time t8, the phase comparator 140 sends the down signal (phase error signal) to the charge pump 150 during the points of time t6 and t7. At the time t8, the count value of the first counter 112 is reset from Q (>M).

Since the time t8, the period of the reference input signal HD returns to the reference period $T_H$. However, as the response of the loop filter 160 and the VCO 100 is not so fast, it takes a considerable time to resolve the phase difference between the first signal HSC50 and the second signal PLL50 that is generated in the period $T_{SKEW}$. For that reason, as in the time period between the points of time t5 and t8, the phase comparator 140 outputs the down signal during the points of time t8 and t9 and during the points of time t9 and t10. Furthermore, during the subsequent period (not shown), the up signal is output continuously by overshoot at the phase locking of the PLL circuit. In the conventional PLL circuit, when only one period of the reference input signal HD is made discontinuous, the cycle of phase comparison is repeated several tens of times until the rising edge of the first signal HSC50 and the trailing edge of the second signal PLL50 match to each other again, thereby to stabilize the control voltage Vf input to the VCO 100 (It takes several tens of horizontal synchronizing periods to stabilize the control voltage Vf). Accordingly, stability of the frequency (period) of the clock CLK output from the VCO 100 is insufficient.

Generally, extension of the horizontal synchronizing period in the period $T_{SKEW}$ is performed before the start of display in the vertical direction on the liquid crystal panel (vertical blanking period). Response to the discontinuity in the period of the reference input signal HD of the PLL circuit needs to be stabilized not later than the start of effective display on the liquid crystal panel (by the start of display of the available image in a first horizontal period). In the conventional PLL circuit, however, it takes a considerable time for the clock CLK output from the VCO 100 to be stabilized after one extension of the period of the reference input signal HD. For that reason, the top curl phenomenon in which an upper part of the display is distorted occurs, resulting in a substantial deterioration in image.

When the reference period of a reference input signal becomes discontinuous only once during a prescribed period and then returns to the original reference input period, a horizontal synchronizing PLL circuit disclosed in Unexamined Patent Publication No. Sho 63-215265 detects a value of a frequency divider in the PLL circuit to generate a pseudo reference input signal, thereby to compensate the reference input signal. However, the PLL circuit has the problem that the period from the compensated signal to the next incoming reference input signal exceeds the reference period of the reference input signal. Moreover, the horizontal synchronizing PLL circuit disclosed in Unexamined Patent Publication No. Sho 63-215265 intends to improve the response stability in the vertical synchronizing period, and cannot address the stabilization of the PLL circuit in the case where only one period of the input reference input signal (HD) is extended during a predetermined period.

BRIEF SUMMARY OF THE INVENTION

The present invention solves the above-mentioned problem of the conventional example and intends to provide a PLL circuit that makes a voltage-controlled oscillator converge to a stable state within a short time and generates a clock signal with high stability even when discontinuity occurs in the period of a reference input signal.

The present invention intends to provide an image display device that generates no top curl phenomenon on the display screen and has an excellent image quality.

To solve the above-mentioned problem, the PLL circuit of the present invention has the following configuration. The PLL circuit from one aspect of the present invention has a voltage-controlled oscillator for varying an oscillating frequency depending on a control voltage and outputting a clock as the oscillating frequency of N times (N is an arbitrary positive integer of 2 or more) as much as the frequency of a reference input signal in a phase locked state; a differentiating circuit for inputting a reference input signal, one period of which is longer than a reference period and other periods of which are almost equal to the reference period within a predetermined period, and outputting a differentiating signal at the incoming timing of the above-mentioned reference input signal; a first counter that is reset by the above-mentioned differentiating signal for outputting a first signal as a signal counted by receiving the above-mentioned clock; a second counter for outputting a second signal as a signal that is counted by receiving the above-mentioned clock; a reset pulse generating circuit for outputting a first reset pulse when the count value of the above-mentioned second counter reaches N; a phase comparator for receiving the above-mentioned first signal and the above-mentioned second signal and outputting a phase error signal that indicates phase difference between both signals; a charge pump for outputting a charge or discharge current to a loop filter in response to the above-mentioned phase error signal; the above-mentioned loop filter for holding and outputting the above-mentioned control voltage and varying the above-mentioned control voltage by the above-mentioned charge or discharge current; and a discontinuous input detecting part for receiving the above-mentioned reference input signal, detecting the above-mentioned reference input signal input initially after its period becomes longer than the reference period by a predetermined value, and outputting a second reset pulse at the incoming timing, and the above-mentioned second counter is reset to be a certain value by the above-mentioned first reset pulse and second reset pulse.

According to the present invention, when the reference input signal is input in a longer period than the reference period only once within a predetermined period, the second counter that constitutes the frequency divider is reset by the second reset pulse. Accordingly, phase difference between the first signal (HSC50) and the second signal (PLL50) does not become large. Therefore, the voltage-controlled oscillator converges to a stable state in a shorter time than conventional example. The period during which "the period becomes longer than the reference period by a predetermined value or more" is set as a period cannot be achieved even when the period becomes longest in the general reference period.

In the above-mentioned PLL circuit from another aspect of the present invention, the above-mentioned discontinuous input detecting part detects that the value of the above-mentioned first counter becomes larger than the count value in the reference period by a predetermined value and then detects the above-mentioned reference input signal input initially and outputs the above-mentioned second differentiating signal at the incoming timing.

When the count value of the first counter reaches a predetermined count value greater than the maximum value in the reference period, the discontinuous input detecting part generates a discontinuous input detecting signal. This allows the discontinuous input detecting part to detect a longer period than the reference period more reliably without causing any malfunction in the reference period.

In the above-mentioned PLL circuit from another aspect of the present invention, the above-mentioned differentiating signal and/or second reset pulse is output at the input timing of the above-mentioned clock. This allows the PLL circuit to be operated more stably.

In the above-mentioned PLL circuit from another aspect of the present invention, the above-mentioned reference input signal is a horizontal synchronizing signal of an image signal in which one vertical synchronizing period is not integral multiples of the period of the horizontal synchronizing signal. The present invention has the effect of realizing the image display device that generates no top curl phenomenon on the display screen and has a much-improved image quality.

An image display device from one aspect of the present invention comprises the above-mentioned PLL circuit and using above-mentioned clock output from above-mentioned voltage-controlled oscillator of above-mentioned PLL circuit and above-mentioned second signal output from above-mentioned second counter of above-mentioned PLL circuit as a driving pulse for shifting an image signal, wherein above-mentioned PLL circuit uses a horizontal synchronizing signal of above-mentioned image signal as above-mentioned reference input signal. The present invention has the effect of realizing the image display device that generates no top curl phenomenon on the display screen and has an excellent image.

According to the present invention, even when the period is extended to be longer than the previous and subsequent period only once, the voltage-controlled oscillator converges to a stable state within a short time. As a result, the advantageous effect of realizing the PLL circuit having a clock with high stability can be obtained.

The present invention has an advantageous effect of realizing the image display device that generates no top curl phenomenon on the display screen and has an excellent image quality.

The novel features of the invention are set forth with particularity in the appended claims. The invention as to both structure and content, and other objects and features thereof will best be understood from the detailed description when considered in connection with the accompanying drawings.

Part or All of the drawings are drawn schematically for diagrammatic representation and it should be considered that they do not necessarily reflect relative size and position of components shown therein.

DETAILED DESCRIPTION OF THE INVENTION

Embodiment that specifically describes best modes for conducting the present invention will be described referring to figures below.

EMBODIMENT

Figure 1:
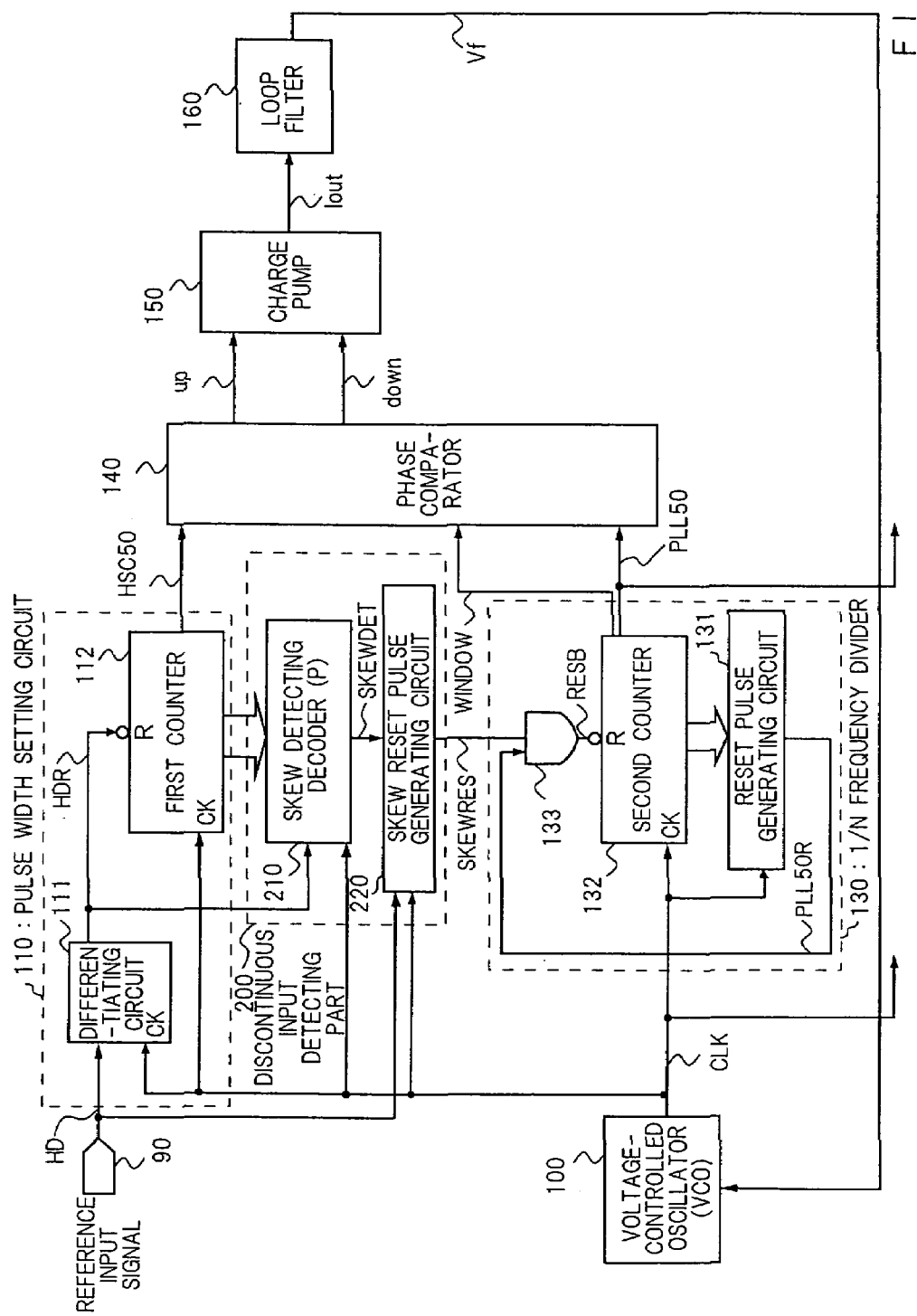
FIG. 1 is a schematic diagram of a PLL circuit in accordance with an embodiment of the present invention.
Figure 2:
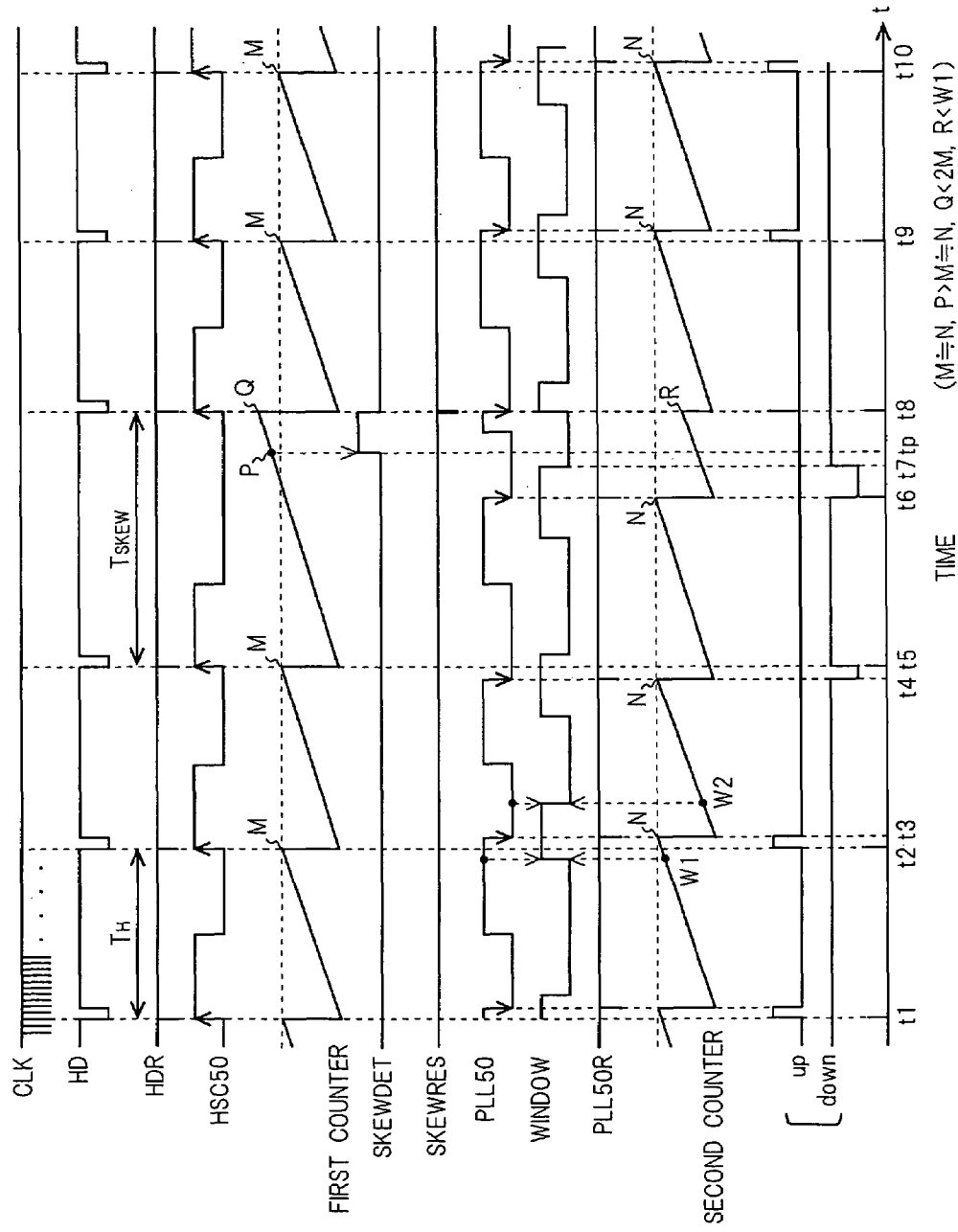
FIG. 2 is a timing chart showing the operation of the PLL circuit in accordance with the embodiment of the present invention.
Figure 3:
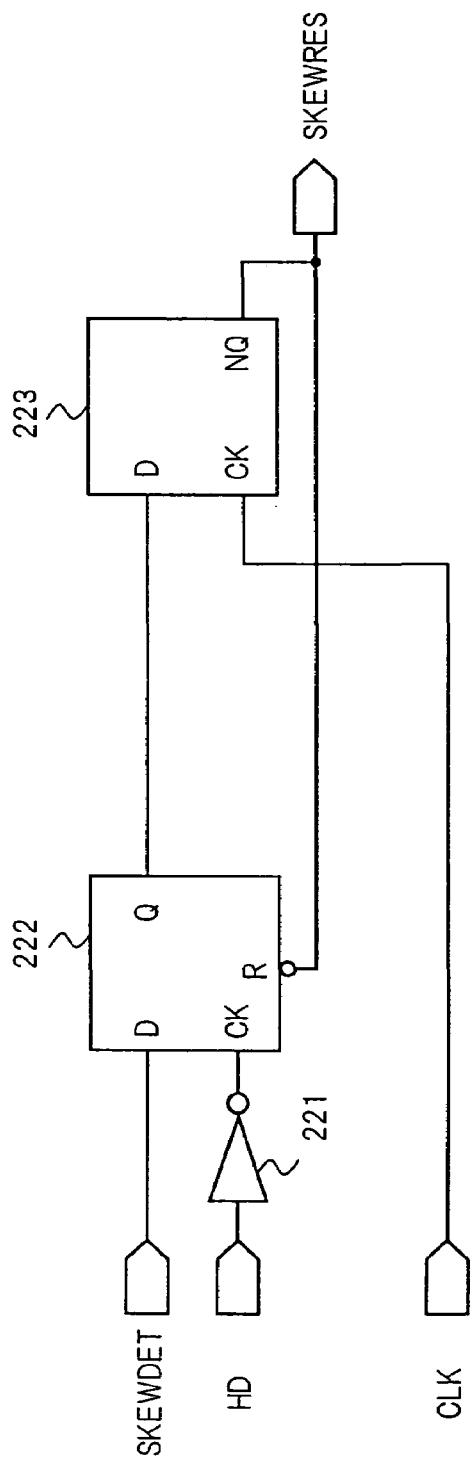
FIG. 3 is a schematic diagram of a skew reset pulse generating circuit that constitutes the PLL circuit in accordance with the embodiment of the present invention.
Figure 4:
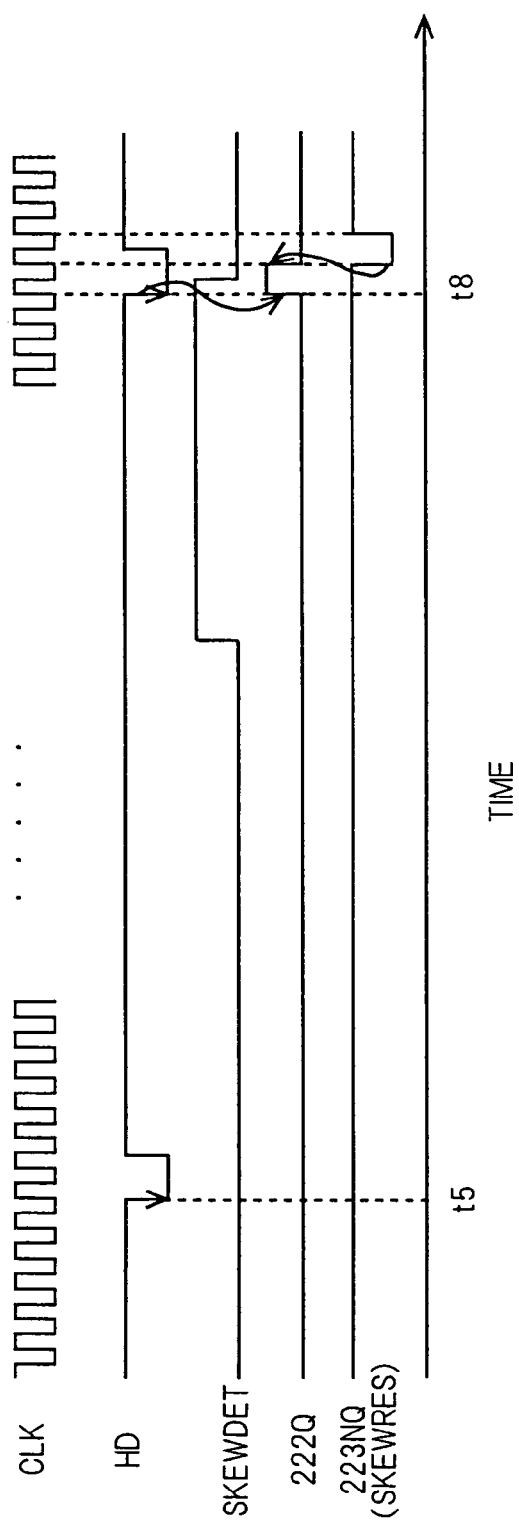
FIG. 4 is a timing chart showing the operation of the skew reset pulse generating circuit that constitutes the PLL circuit in accordance with the embodiment of the present invention.

Referring to FIGS. 1, 2 and 3, a PLL circuit in accordance with an embodiment of the present invention will be described. FIG. 1 is a schematic diagram of the PLL circuit in accordance with the embodiment of the present invention. The PLL circuit of the embodiment has a reference input signal input terminal 90, a pulse width setting circuit 110, a phase comparator 140, a charge pump 150, a loop filter 160, a voltage-controlled oscillator (VCO) 100, a 1/N frequency divider 130 and a discontinuous input detecting part 200. The pulse width setting circuit 110 has a differentiating circuit 111 and a first counter 112. The 1/N frequency divider 130 has a second counter 132, a reset pulse generating circuit 131 and an AND gate circuit 133 (LOW logic OR circuit). The discontinuous input detecting part 200 has a skew detecting decoder 210 and a skew reset pulse generating circuit 220. The loop filter 160 is comprised of an integrating circuit (not shown) having a capacitor and a resistance. For simplified explanation, in the PLL circuit of the embodiment, the same reference numerals are assigned to the same block in the conventional PLL circuit (FIG. 4).

The VCO 100 feeds a clock CLK to the differentiating circuit 111, the first counter 112, the skew detecting decode 210, the skew reset pulse generating circuit 220, the second counter 132 and the reset pulse generating circuit 131. The pulse width setting circuit 110 outputs a first signal HSC50 based on a reference input signal HD. The discontinuous input detecting part 200 outputs a second differentiating pulse SKEWRES (skew reset pulse) based on a value of the first counter 112 and the reference input signal HD. The 1/N frequency divider 130 outputs a second signal PLL50 based on the clock CLK and the second differentiating pulse SKEWRES. The phase comparator 140 compares the first signal HSC50 and the second signal PLL50 and outputs a phase error signal (up signal or down signal). Based on the phase error signal, the charge pump 150 passes a charge current $I_{up}$ or a discharge current $I_{down}$ to a control voltage Vf held by the capacitor of the loop filter 160. The loop filter 160 outputs the control voltage Vf. The VCO 100 receives a feedback input of the control voltage Vf and oscillates at the corresponding frequency to output the clock CLK.

The PLL circuit of the embodiment is included in an image display device (liquid crystal display device in the embodiment) and is the circuit for generating a clock to drive the device. The reference input signal HD is a horizontal driving signal (horizontal synchronizing signal) extracted from an image signal input to the image display device. An output pulse of the VCO 100 (hereinafter referred to as "clock") is used as a pixel driving pulse for shifting the input image signal on a pixel-by-pixel basis in the lateral direction (to input the image signal to a shift register with a length of one horizontal period). An output pulse of the second counter 132 (output pulse of the 1/N frequency divider 130) is used as a driving pulse for shifting an image signal of one horizontal period every horizontal period in the longitudinal direction. In the embodiment, the image signal input to the image display device is an image signal according to PAL system. Only one horizontal synchronizing period of the input image signal is extended to be longer than a reference period $T_H$ during one vertical synchronizing period TV and then has a period $T_{SKEW}$ less than twice as long as the reference period $T_H$. Other horizontal synchronizing periods become the reference period $T_H$.

The input image signal of the image display device may be other arbitrary image signal (such as NTSC signal), one field of which is not integral multiples of the horizontal synchronizing period. In the NTSC signal, the vertical synchronizing period TV of one field (period of the vertical synchronizing signal VD) is equal to 262.5 horizontal synchronizing periods $T_H$ (1 TV=262.5 $T_H$).

When a predetermined time more than the reference period $T_H$ has elapsed after the input of the reference input signal HD (the count value of the first counter 112 reaches P), the discontinuous input detecting part 200 detects the trailing edge of reference input signal HD input initially and outputs the second differentiating pulse SKEWRES (active in a low level) having a time width for one period of the clock CLK at the trailing edge as a starting point. The predetermined time more than the reference period $T_H$ (the time of the count value P) is set as a value that the discontinuous input detecting part 200 does not outputs the second differentiating pulse SKEWRES depending on the change in the regular horizontal synchronizing period (reference period $T_H$), and outputs the period $T_{SKEW}$ less than twice as long as the reference period $T_H$.

When the period of the reference input signal HD becomes the period $T_{SKEW}$ longer than the reference period $T_H$, the count value of the first counter 112 increases up to Q greater than M and is reset. The skew detecting decoder 210 of the discontinuous input detecting part 200 is a magnitude comparator for comparing the count value of the first counter 112 and the predetermined value P (M<P<Q) and outputting the comparison result. The skew detecting decoder 210 generates a discontinuous input detecting signal SKEWDET that becomes active (high level) when the count value of the first counter 112 reaches the predetermined value P, and becomes low level when the next reference input signal HD arrives.

The skew reset pulse generating circuit 220 is a differentiating circuit that detects the trailing edge of the discontinuous input detecting signal SKEWDET (trailing edge of the reference input signal HD) and generates the second differentiating pulse (skew reset pulse) SKEWRES for one period of the clock CLK. The skew reset pulse generating circuit 220 will be described in detail later.

The AND gate circuit 133 (low logic OR (logical OR) circuit) receives the reset pulse PLL50R and the second differentiating pulse SKEWRES and if either of the input signals is low level, inputs the signal as a reset pulse RESB (low level) to the reset input terminal of the second counter 132 that constitutes the 1/N frequency divider 130 (active at low level). That is, the second counter 132 is reset by the second differentiating pulse SKEWRES when discontinuity (skew) occurs in the reference input signal HD and is self-reset by the reset pulse PLL50R when no discontinuity (skew) occurs in the reference input signal HD.

As the second counter 132 is reset by the second differentiating pulse SKEWRES when skew occurs, the phase comparing timing (trailing edge) of the second signal PLL50 occurs in the proximity of the phase comparing timing (rising edge) of the first signal HSC50. Subsequently, the phase comparator 140 generates only small phase error signal and the PLL circuit of the embodiment shifts to a stable state rapidly. In the image display device, the horizontal driving signal becomes stabilized before the available image is displayed (before the first horizontal scanning line is displayed), thereby to prevent top curl from occurring in the upper part of the displayed image.

Figure 6:
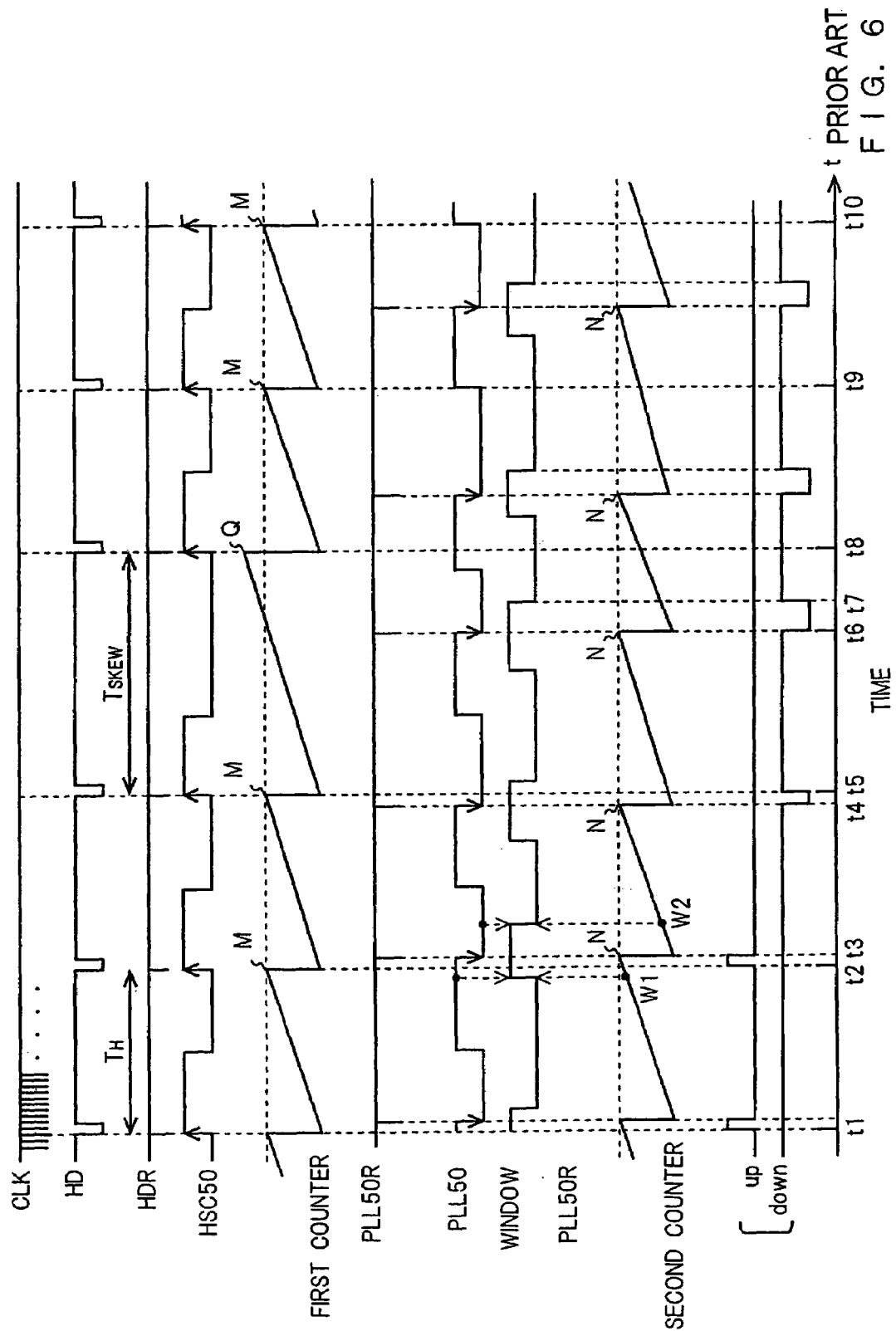
FIG. 6 is a timing chart showing the operation of the conventional PLL circuit.

Referring to FIG. 2, the operation of the PPL circuit in accordance with the embodiment will be described in detail. FIG. 2 is a timing chart showing the operation of the PLL circuit in accordance with the embodiment of the present invention. The reference input signal HD is a pulse signal having $T_H$ as the reference period. The waveform of the reference input signal HD in FIG. 2 is the same as that of the reference input signal HD in the figure for illustrating the operation of the conventional PLL circuit (FIG. 6). At times t1, t2, t5, t8, t9 and t10 in FIG. 2, a pulse of the reference input signal HD arrives.

As the time periods between the points of time t1 and t2 and between the points of time t2 and t5 are the reference period $T_H$, the first counter 112 is reset at the count value M close to N. As the count value of the first counter 112 does not reach the decode count value P of the skew detecting decoder 210, the discontinuous input detecting signal SKEWDET remains to be low level. Therefore, the second differentiating pulse SKEWRES is not generated. In the time periods between the points of time t1 and t2 and between the points of time t2 and t5, 1/N frequency divider 130 performs the same operation as the 1/N frequency divider 430 of the conventional PLL circuit. In the case where the period of the reference input signal HD is stable in the proximity of the reference period $T_H$, the PLL circuit can lock the period $T_{CLK}$ of the clock CLK output by the VCO 100 to $T_H / N$ by repeating such feedback.

Next, the operation of the PLL circuit of the embodiment in the case where the period of the reference input signal HD is extended to be longer than the reference period $T_H$ only once (period $T_{SKEW}$) and then returned to be the reference period $T_H$ again will be described below.

At the times t5, t8, t9 and t10 in FIG. 2, the trailing edge of the reference input signal HD arrives. During the times t5 and t8, the period of the reference input signal HD is extended to be longer than the reference period $T_H$, thereby to be the period $T_{SKEW}$. During the points of time t8 and t9 and during the points of time t9 and t10, the period of the reference input signal HD is almost equal to the reference period $T_H$.

While the reference input signal HD arrives in the proximity of the time t6 when the period of the reference input signal HD remains to be the reference period $T_H$, the reference input signal HD arrives at the time t8 later than the time t6 in the period $T_{SKEW}$. The phase comparator 140 starts outputting the down signal as the phase error signal at the time t6. The phase difference between the first signal HSC50 and the second signal PLL50 is expressed as the time period between the points of time t6 and t8. Nevertheless, as the window signal WINDOW shifts to the low level at the time t7 prior to the time t8, the phase comparator 140 stops outputting the down signal (phase error signal) at the time t7 (sends the down signal to the charge pump 150 during the time period between the points of time t6 and t7). The operation of the PLL circuit in accordance with the embodiment until the time t7 is the same as that of the conventional PLL circuit (See FIG. 6).

At a time tp, the count value of the first counter 112 reaches the predetermined value P. The skew detecting decoder 210 makes the discontinuous input detecting signal SKEWDET active (high level).

At the time t8, the next reference input signal arrives. The count value of the first counter 112 is reset from Q (>M) and the differentiating circuit 111 generates the first differentiating pulse HDR. The skew detecting decoder 210 brings the discontinuous input detecting signal SKEWDET back into low level by the reference input signal HD at the time t8. The skew reset pulse generating circuit 220 detects the trailing edge of the discontinuous input detecting signal SKEWDET and generates the second differentiating pulse SKEWRES for one period of the clock CLK.

At the time t8, the second counter 132 is reset by the second differentiating pulse SKEWRES at the counter value R (<N). As a result, immediately after the time t8, the second signal PLL50 falls. Furthermore, as the counter value is equal to W1 or less, the second counter 132 generates the window signal WINDOW at the time t8. In FIG. 2, the rising edge of the first signal HSC50 and the trailing edge of the second signal PLL50 are generated simultaneously or with a slight time difference and both fall within the window signal WINDOW. The phase comparator 140 sends a short up signal (phase error signal) to the charge pump 150.

Figure 5:
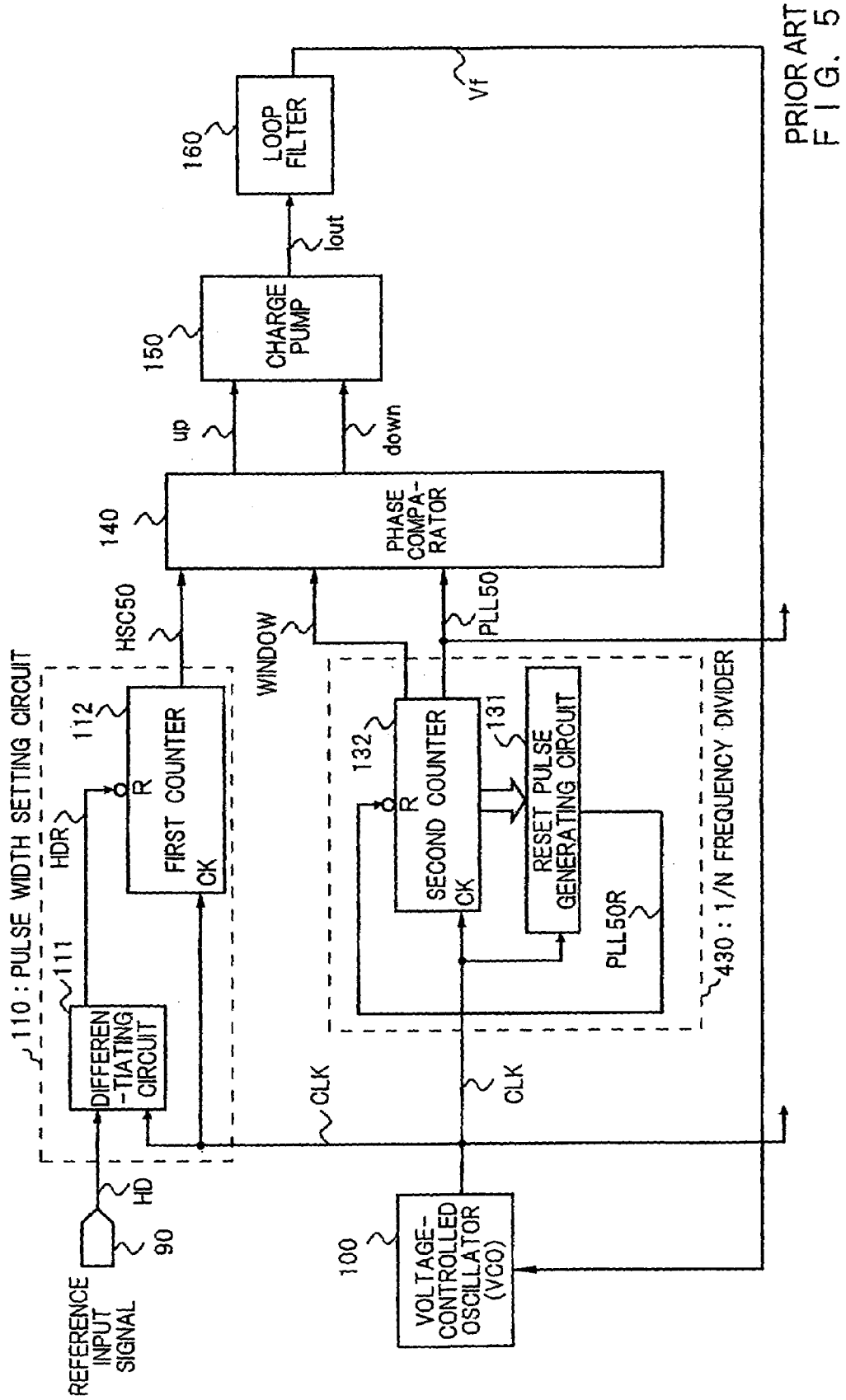
FIG. 5 is a schematic diagram of a conventional PLL circuit.

Since the time t8, the period of the reference input signal HD returns to the reference period $T_H$. In the PLL circuit of the embodiment, the trailing edge of the second signal PLL50 is generated at the time t8. Therefore, when the reference input signal HD of the reference period $T_H$ arrives again (the times t9 and t10), phase difference between the first signal HSC50 and the second signal PLL50 falls within a proper range. In the PLL circuit of the embodiment, after the time t8, the clock CLK output from the VCO 100, is stabilized with a much smaller number of phase comparisons than the conventional PLL circuit (FIG. 5).

In the example as shown in FIG. 2, in the period during which the second signal PLL50 is high level, the second differentiating pulse SKEWRES is generated and the second signal PLL50 falls. Alternatively, in the period during which the second signal PLL50 is low level, the second differentiating pulse SKEWRES may be generated. In this case, as the decode count value P of the skew detecting decoder 210 arrives later than the count value W2 at the termination timing of the window signal WINDOW, the timing of the second differentiating pulse SKEWRES does not fall within the period during which the window signal WINDOW is high level. Therefore, the phase comparator 140 does not generate a phase error signal. Furthermore, although the trailing edge of the second signal PLL50 does not occur, if the phase comparator 140 is a gate circuit-type of comparator (it is not with the configuration in which phase is compared by using the trailing edge of the second signal PLL50), the same operation as in the embodiment is performed.

Referring to FIG. 3, the configuration and operation of the skew reset pulse generating circuit 220 will be described below. FIG. 3 is a schematic diagram of the skew reset pulse generating circuit 220 that constitutes the PLL circuit in accordance with the embodiment of the present invention. FIG. 4 is a timing chart showing the operation of the skew reset pulse generating circuit 220 that constitutes the PLL circuit in accordance with the embodiment of the present invention.

The skew reset pulse generating circuit 220 has an inverter 221 and D flip flop (D-FF) 222, 223. The SKEWRES signal is input to a data input terminal D of the D-FF 222, the reference input signal HD is input to a clock input terminal CK through the inverter 221 and a non-inverting output terminal Q is connected to the data input terminal D of the D-FF 223. The clock CLK is input to the clock input terminal CK of the D-FF 223. A inverting output terminal NQ of the D-FF 223 outputs the second differentiating pulse SKEWRES. The inverting output terminal NQ of the D-FF 223 is connected to a reset input terminal R of the D-FF 222.

The discontinuous input-detecting signal SKEWDET is an output of the skew detecting decoder 210 and shifts from low level to high level at the point when the count value P of the first counter 112 reaches P. The D-FF 222 captures the signal SKEWDET that shifted to high level at the trailing edge of the reference input signal HD input later (at the time t8). At the rising edge of the clock CLK, D-FF 223 captures the signal SKEWDET of high level that captured in the D-FF 222 and outputs the second differentiating pulse SKEWRES of low level from the inverting output terminal NQ. As the inverting output terminal NQ of the D-FF 223 is the reset input terminal R of the D-FF 222, the D-FF 222 is reset and the non-inverting output terminal Q of the D-FF 222 returns from high level to low level. The D-FF 223 captures the low level at the next clock CLK and the inverting output terminal NQ returns from low level to high level. With the above-mentioned operation, the inverting output terminal NQ of the D-FF 223 outputs the second differentiating pulse SKEWRES for one period of the clock CLK.

In the PLL circuit of the embodiment, even if only one period of the reference input signal HD is extended to be longer than other periods within a predetermined period (such as one vertical synchronizing period), the voltage-controlled oscillator converges to be in a stable state within a short time so that the clock with high stability can be obtained.

In the image display devices having display pixels (for example, liquid crystal display device, plasma display and micromirror display device), the PLL circuit that uses the horizontal synchronizing signal as the reference input signal HD is employed. As the PLL circuit of the present invention can generate the clock with high stability, no top curl phenomenon occurs in the display screen of the liquid crystal display device.

The PLL circuit of the present invention is useful as the PLL circuit used in the devices such as image display devices.

While preferred embodiments of the present invention have been described in detail to a certain degree, it is to be understood that, within the scope and spirit of the claims made herein, the invention may be practiced otherwise than as specifically described herein, the invention may be modified in arrangement and detail without departing from such scope and spirit.

The invention claimed is:

1. A PLL (Phase Locked Loop) circuit comprising:
a voltage-controlled oscillator for varying an oscillating frequency depending on a control voltage, and outputting a clock as the oscillating frequency of N times (N is an arbitrary positive integer of 2 or more) as much as the frequency of a reference input signal in a phase locked state, the reference input signal including synchronizing signals generated within a predetermined time interval at periods including one first period, and plural second periods, each of the plural second periods being smaller than the first period;
a differentiating circuit for inputting the reference input signal, and outputting a differentiated signal at timings of the synchronizing signals of the reference input signal;
a first counter for counting the clock and outputting a first signal representing a count value thereof, said first counter being reset by the differentiated signal;
a second counter for counting the clock and outputting a second signal representing a count value thereof;
a reset pulse generating circuit for outputting a first reset pulse when the count value of said second counter reaches N;
a phase comparator for receiving said first signal and said second signal and outputting a phase error signal that indicates phase difference between the first and second signals;
a charge pump for outputting a charge or discharge current to a loop filter in response to said phase error signal;
said loop filter for holding and outputting said control voltage and varying said control voltage by said charge or discharge current; and
a discontinuous input detecting part for receiving the reference input signal, and outputting a second reset pulse upon receiving a synchronizing signal initially generated after the first period is elapsed from the timing when receiving a further synchronizing signal generated after the second period, wherein
said second counter is reset to be a certain value in accordance with one of the first reset pulse and the second reset pulse.

2. The PLL circuit, as claimed in claim 1, wherein said discontinuous input detecting part outputs the second reset pulse upon receiving a synchronizing signal initially generated after the count value of said first counter becomes larger than a count value thereof corresponding to the second period.

3. The PLL circuit, as claimed in claim 2, wherein said reference input signal is a horizontal synchronizing signal of an image signal in which one vertical synchronizing period is not integral multiples of the period of the horizontal synchronizing signal.

4. The PLL circuit, as claimed in claim 1, wherein said differentiated signal and/or said second reset pulse is output at the input timing of said clock.

5. The PLL circuit, as claimed in claim 4, wherein said reference input signal is a horizontal synchronizing signal of an image signal in which one vertical synchronizing period is not integral multiples of the period of the horizontal synchronizing signal.

6. The PLL circuit, as claimed in claim 1, wherein said reference input signal is a horizontal synchronizing signal of an image signal in which one vertical synchronizing period is not integral multiples of the period of the horizontal synchronizing signal.

7. An image display device comprising said PLL circuit claimed in claim 1 and using said clock output from said voltage-controlled oscillator of said PLL circuit and said second signal output from said second counter of said PLL circuit as driving pulses for shifting an image signal, wherein
said PLL circuit uses a horizontal synchronizing signal of said image signal as said reference input signal.

* * * * *